United States Patent
Kang

(10) Patent No.: US 8,179,732 B2
(45) Date of Patent: May 15, 2012

(54) FLASH MEMORY DEVICES INCLUDING READY/BUSY CONTROL CIRCUITS AND METHODS OF TESTING THE SAME

(75) Inventor: Sang-gu Kang, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 605 days.

(21) Appl. No.: 12/370,227

(22) Filed: Feb. 12, 2009

(65) Prior Publication Data

US 2009/0207663 A1    Aug. 20, 2009

(30) Foreign Application Priority Data

Feb. 14, 2008    (KR) .................. 10-2008-0013486

(51) Int. Cl.
*G11C 7/00* (2006.01)
(52) U.S. Cl. ................... 365/191; 365/201; 365/225.7
(58) Field of Classification Search .................. 365/191, 365/201, 225.7, 200, 185.18
See application file for complete search history.

(56) References Cited

U.S. PATENT DOCUMENTS 5,297,029 A * 3/1994 Nakai et al. ................ 365/238.5

FOREIGN PATENT DOCUMENTS

| JP | 10-12322 | 5/1998 |
|---|---|---|
| KR | 10-1997-0003271 | 1/1997 |
| KR | 1020020083277 A | 11/2002 |
| KR | 1020040093787 A | 11/2004 |

* cited by examiner

*Primary Examiner* — Richard Elms
*Assistant Examiner* — Hien Nguyen
(74) *Attorney, Agent, or Firm* — Myers Bigel Sibley & Sajovec

(57) ABSTRACT

A flash memory device includes a chip disable fuse circuit that has a fuse and that outputs a chip disable signal when the fuse is cut out, and a ready/busy control circuit that forcibly activates a ready/busy signal representing an internal operational state in response to the chip disable signal and externally outputs the ready/busy signal through a ready/busy output pin.

19 Claims, 5 Drawing Sheets

FLASH MEMORY DEVICES INCLUDING READY/BUSY CONTROL CIRCUITS AND METHODS OF TESTING THE SAME

CROSS-REFERENCE TO RELATED APPLICATION

This application claims priority under 35 U.S.C. §119 from Korean Patent Application No. 10-2008-0013486, filed on Feb. 14, 2008, in the Korean Intellectual Property Office, the disclosure of which is incorporated herein in its entirety by reference.

BACKGROUND

The present invention relates to flash memory devices, and more particularly, to flash memory devices including a ready/busy control circuit and methods of testing the same.

Typically, a series of test procedures are used to determine whether the characteristics of memory devices such as flash memory devices satisfy required specifications. If a flash memory device includes a defective chip which fails to satisfy the required specifications, the entire test process of the flash memory device may be affected by the defective chip. For example, if the defective chip fails to meet the requirements for programming time, the defective chip may not be able to complete all programming operations within a required time, in contrast to a good chip (i.e., a chip that passed a verification process), so that the entire testing time of the flash memory device may be increased.

Therefore, a flash memory device may include a chip disable fuse circuit that can be used to minimize or reduce the influence of a defective chip on the entire testing time of the flash memory device. If a defective chip is identified during a test, a fuse in the chip disable fuse circuit is cut out (i.e. open-circuited), which causes the defective chip to become permanently disabled. In other words, the defective chip is made completely inoperable, so that it cannot influence the test of the flash memory device.

FIG. 1 is a block diagram schematically illustrating a conventional flash memory device. Referring to FIG. 1, a conventional flash memory device includes a chip disable fuse circuit 15 and a chip enable control circuit 17 that function to reduce or minimize the influence of a defective chip on the test of the flash memory device.

When the fuse in the chip disable fuse circuit 15 is cut out, a chip disable signal DIS is activated. Subsequently, a chip enable signal nCE is forced to a logic high level in response to a control signal CECON generated in the chip enable control circuit 17. The chip enable signal nCE is a signal that indicates whether or not the flash memory device is enabled, and is externally input to the flash memory device through a chip enable pin /CE.

When the chip enable signal nCE has a logic high level, a command receipt circuit 11 does not process any external commands. In other words, when the chip enable signal nCE is at a logic high level, commands input into the command receipt circuit 11 are blocked, so that the commands cannot be delivered to a flash memory internal circuit 13 through the command receipt circuit 11. As a result, the flash memory internal circuit 13 is made inoperable.

Therefore, if the fuse of the chip disable fuse circuit 15 in the defective chip is cut out during the test, that defective chip becomes completely inoperable, and does not influence other chips during the test of the flash memory device.

Furthermore, the flash memory device includes a short current generation circuit 19 in order to readily determine whether or not the there is a failure during the test. When the chip disable signal DIS is generated, the short current generation circuit 19 forms an electrical short path to generate an electrical short current.

However, in the conventional flash memory device as described above, no commands are input to the internal circuit 13 of the flash memory device after the fuse of the chip disable fuse circuit 15 is cut out. Therefore, if a good chip is incorrectly determined to be defective due to an erroneous test or set-up process, and the fuse of the chip disable fuse circuit corresponding to that chip is cut out (i.e., a good chip is erroneously disabled), it is no longer possible to correct the state of the disabled chip.

SUMMARY

A flash memory device according to some embodiments includes a ready/busy output pin that outputs a ready/busy signal representing an internal operational state of the flash memory device, a chip disable fuse circuit that includes a fuse and that outputs a chip disable signal when the fuse is cut out, and a ready/busy control circuit that forcibly activates the ready/busy signal output through the ready/busy output pin in response to the chip disable signal.

The flash memory may further include a command receipt circuit that receives external commands input through a command input pin, a flash memory internal circuit that operates in response to the commands input through the command receipt circuit, and a short current generation circuit that allows a short current to flow in response to the chip disable signal.

The ready/busy signal may be set to a first logic level when the flash memory internal circuit performs data programming, deletion, and/or reading operations, whereas the ready/busy signal is set to a second logic level, different from the first logic level, when the flash memory internal circuit completes the data programming, deletion, and/or reading operations.

The command receipt circuit may receive and process the commands regardless of whether or not the fuse is cut out, i.e., regardless of the state of the ready/busy signal or the chip disable signal.

Methods of testing a flash memory device include activating a chip disable signal by cutting out a fuse for disabling a chip in the flash memory device, forcibly activating a ready/busy signal representing an operational state of the flash memory device in response to activating the chip disable signal, outputting the activated ready/busy signal outside of the flash memory device through the ready/busy output pin, and determining, in response to the ready/busy signal, that the flash memory device is not operational.

The methods may further include flowing an electrical short current in response to activating the chip disable signal.

The ready/busy signal may be set to a first logic level when the flash memory device performs data programming, deletion, and/or reading operations, whereas the ready/busy signal is set to a second logic level, different from the first logic level, when the flash memory device completes the data programming, deletion, and/or reading operations.

A flash memory device according to some embodiments includes a flash memory core including a flash memory internal circuit. An external output pin is coupled to the flash memory core. The flash memory device further includes a chip disable fuse circuit that is configured to output a chip disable signal when a fuse is cut out, and a control circuit that is configured to generate a control signal in response to the chip disable signal and to apply the control signal to the external output pin.

The flash memory device may further include a chip enable pin that is coupled to the flash memory core and that is configured to receive a chip enable signal, and a command receipt circuit in the flash memory core that is configured to receive and process external commands in response to the chip enable signal irrespective of a state of the chip disable signal.

The external output pin may include a ready/busy output pin that is configured to output a ready/busy signal indicative of an internal operational state of the flash memory device.

The flash memory device may further include a ready/busy control circuit that is configured, in response to the chip disable signal, to force the ready/busy signal to a logic level indicating that the flash memory device is not operational.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION OF EMBODIMENTS

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises," "comprising," "includes," "having" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

Figure 1:
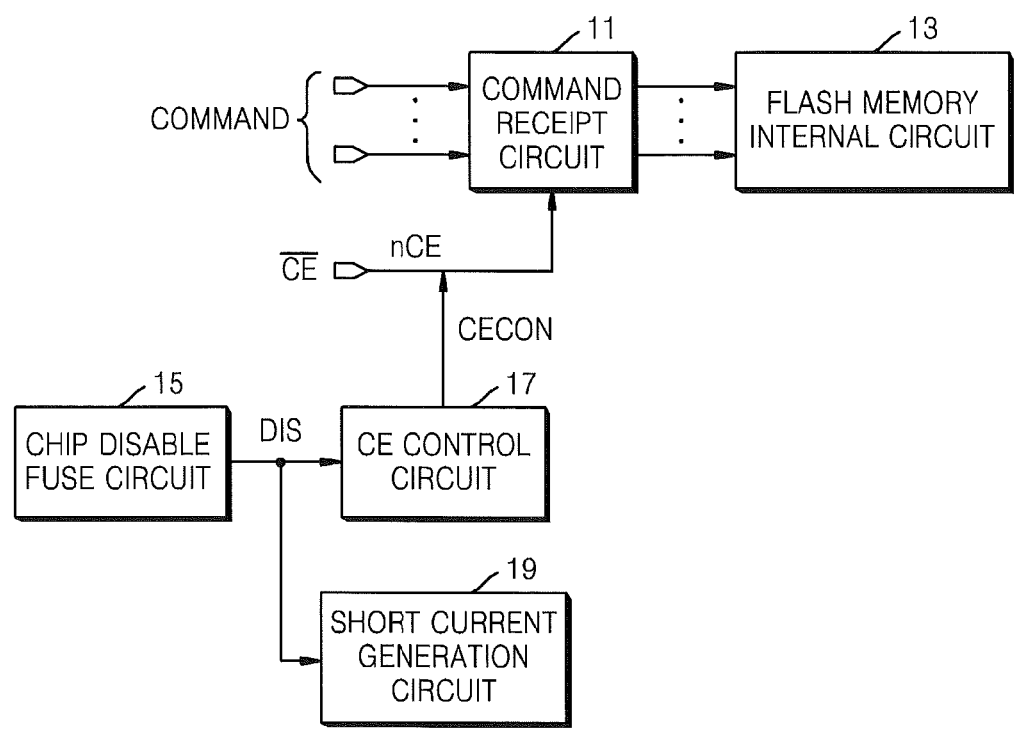
FIG. 1 is a block diagram schematically illustrating a conventional flash memory device having a chip disable fuse signal.
Figure 2:
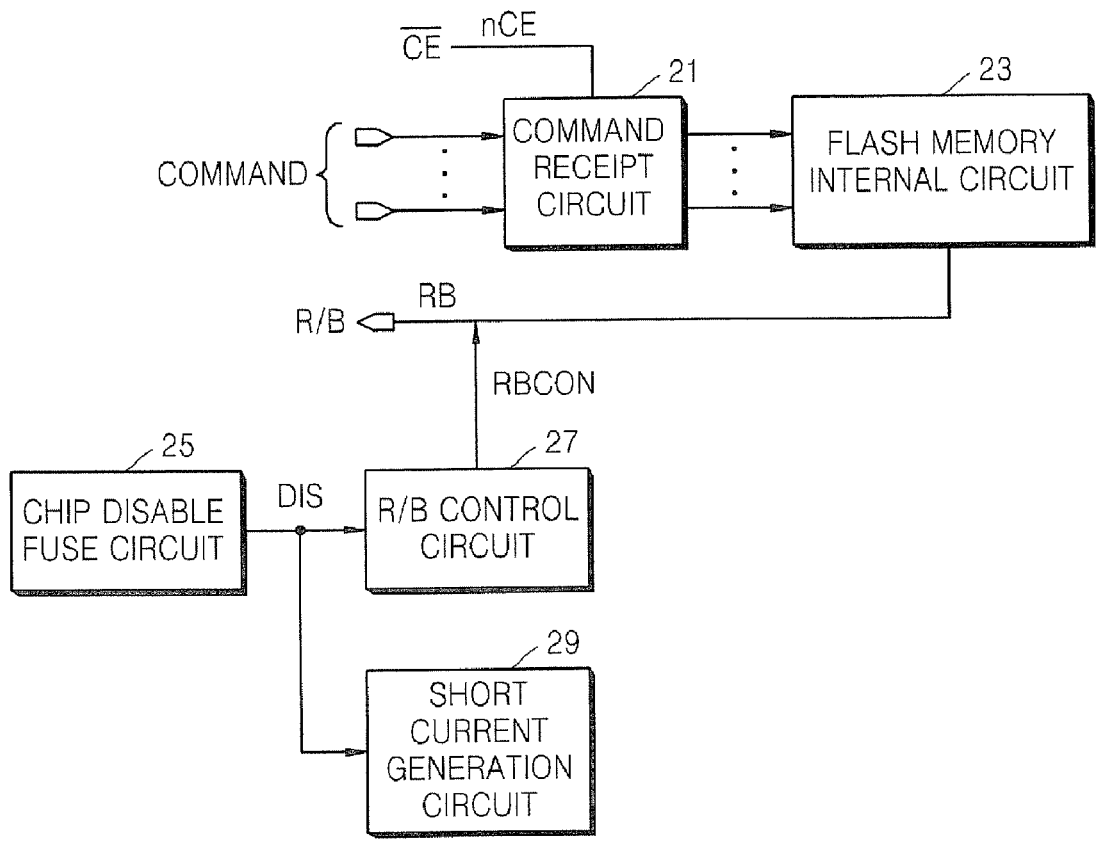
FIG. 2 is a block diagram schematically illustrating a flash memory device having a chip disable fuse circuit according to some embodiments.

FIG. 2 is a block diagram illustrating a flash memory device according to some embodiments. Referring to FIG. 2, the flash memory device includes a command receipt circuit 21 coupled to a flash memory internal circuit 23. A chip disable fuse circuit 25 is coupled to a ready/busy (R/B) control circuit 27 and a short current generation circuit 29.

The command receipt circuit 21 receives external commands input through one or more command input pins in response to a chip enable signal nCE input through a chip enable pin/CE. The flash memory internal circuit 23 operates in response to the commands input through the command receipt circuit 21.

The ready/busy signal RB is a signal representing an operational state of the flash memory internal circuit 23, and is externally output through a ready/busy output pin R/B. The ready/busy signal RB is placed in a logic high level when the flash memory internal circuit 23 performs data programming, deletion, and/or reading operations, indicating that the flash memory internal circuit 23 is busy, whereas the ready/busy signal RB is placed in a logic low level when the flash memory internal circuit 23 has completed data programming, deletion, and/or reading operations, indicating that the flash memory internal circuit 23 is ready.

The chip disable fuse circuit 25 includes a fuse for disabling a chip. When the fuse is cut out, a chip disable signal DIS is output to the ready/busy control circuit 27 and the short current generation circuit 29. In particular, the ready/busy control circuit 27 forces the ready/busy signal RB to a logic high level, indicating that the flash memory internal circuit 23 is busy, in response to the chip disable signal DIS.

A short current generation circuit 29 is provided to readily determine whether or not there is a failure during the test. The short current generation circuit 29 forms an internal electrical short path to allow an electrical short current to flow when the chip disable signal DIS is activated.

More specifically, in the flash memory device according to some embodiments, the chip disable signal DIS is activated to a logic high level when the fuse in the chip disable fuse circuit 25 is cut out. Subsequently, the ready/busy signal RB is forced to a logic high level in response to the ready/busy control signal RBCON generated in the ready/busy control circuit 27. If the ready/busy signal RB that was forced to a logic high level is externally output through a ready/busy output pin R/B, it is determined that the flash memory device is not operating.

Therefore, if the fuse in the chip disable fuse circuit 25 is cut out when the flash memory device fails during the test, the ready/busy signal RB is forced to a logic high level, and it is determined that the flash memory device is not operating. As a result, the flash memory device does not influence the entire test process.

Additionally, in a flash memory device according to some embodiments, it is possible to correct the state of a disabled chip, if necessary, by inputting a chip enable signal nCE and commands even after the fuse in the chip disable fuse circuit 25 is cut out (i.e., after the flash memory device is disabled).

Specifically, when the chip enable signal nCE is forced to a logic low level, and commands are input, the command receipt circuit 21 receives commands and outputs them to the flash memory internal circuit 23 regardless of whether or not the fuse in the chip disable fuse circuit 25 is cut out (i.e., regardless of the state of the chip disable signal DIS). Accordingly, the flash memory internal circuit 23 can operate normally.

Figure 3:
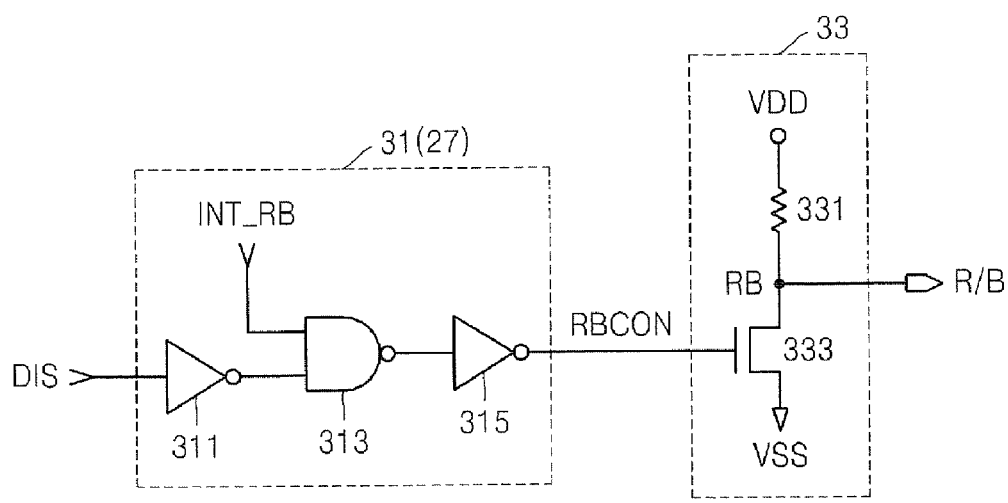
FIG. 3 is a circuit diagram illustrating an exemplary ready/busy control circuit of FIG. 2, according to some embodiments.

FIG. 3 is a circuit diagram illustrating an exemplary ready/busy control circuit 27 of FIG. 2, according to some embodiments.

Referring to FIG. 3, the ready/busy control circuit 31 (corresponding to reference numeral 27 in FIG. 2) includes a first inverter 311 for inverting the chip disable signal DIS, a NAND gate 313 for receiving an output signal of the first inverter 311 and an internal ready/busy signal INT_RB generated in the flash memory internal circuit 23 of FIG. 2, and a second inverter for inverting the output signal of the NAND gate 313 to generate a ready/busy control signal RBCON.

Although not shown in FIG. 2, the flash memory device according to some embodiments of the present invention further includes a ready/busy signal output circuit 33 connected to the ready/busy output pin R/B. The ready/busy signal output circuit 33 includes a pull-up resistor 331 and a pull-down transistor 333 connected between a power voltage VDD and a ground voltage VSS. The ready/busy control signal RBCON is applied to the gate of the pull-down transistor 333. The ready/busy signal RB is output from a connecting node between the pull-up resistor 331 and the pull-down transistor 333, and the ready/busy output pin R/B is connected to the connecting node.

The ready/busy control signal RBCON and the ready/busy signal RB may be controlled by the chip disable signal DIS and the internal ready/busy signal INT_RB according to the relationship set forth in Table 1.

TABLE 1

Relationship of RBCON and RBC to DIS and INT_RB

| Case | DIS | INT_RB | RBCON | RB |
|---|---|---|---|---|
| 1 | H | H | L | H |
| 2 | H | L | L | H |
| 3 | L | H | H | L |
| 4 | L | L | L | H |

Figure 4:
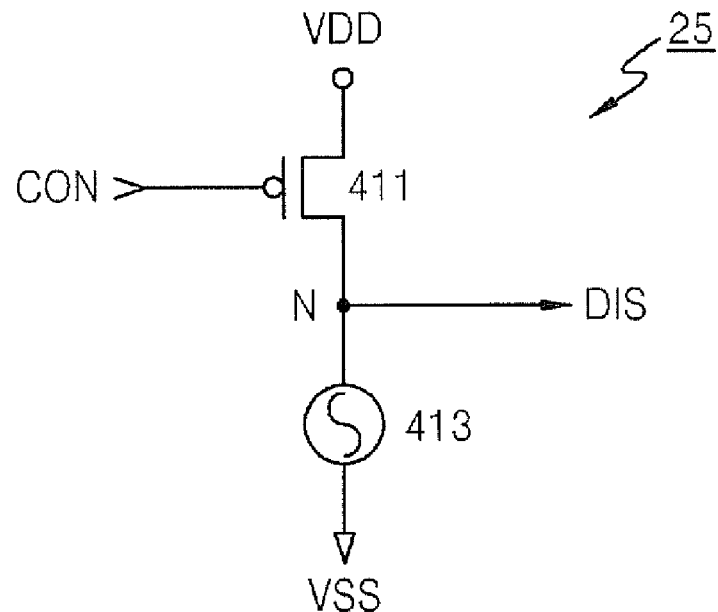
FIG. 4 is a circuit diagram illustrating an exemplary chip disable fuse circuit of FIG. 2, according to some embodiments.

Referring to FIG. 3 and Table 1, when the chip disable signal DIS has a logic high level (i.e., when the fuse 413 in the chip disable fuse circuit shown in FIG. 4 is cut out), represented by Case 1 and Case 2 in Table 1, the ready/busy control signal RBCON generated in the second inverter 315 has a logic low level. Accordingly, the pull-down transistor 333 is turned off, and the ready/busy signal RB has a logic high level.

When the chip disable signal DIS has a logic low level (i.e., when the fuse 413 in the chip disable fuse circuit shown in FIG. 4 is not cut out), and when the internal ready/busy signal INT_RB has a logic high level (i.e., when the flash memory internal circuit 23 is operating), represented by Case 3 in Table 1, the ready/busy control signal RBCON has a logic high level. Accordingly, the pull-down transistor 333 is turned on, and the ready/busy signal RB has a logic low level.

When the chip disable signal DIS has a logic low level (i.e., when the fuse 413 in the chip disable fuse circuit shown in FIG. 4 is not cut out), and when the internal ready/busy signal INT_RB has a logic low level (i.e., when the flash memory internal circuit 23 is not operating), represented by Case 4 in Table 1, the ready/busy control signal RBCON has a logic low level. Accordingly, the pull-down transistor 33 is turned off, and the ready/busy signal RB has a logic high level.

FIG. 4 is a circuit diagram illustrating an exemplary chip disable fuse circuit of FIG. 2, according to some embodiments.

Referring to FIG. 4, the chip disable fuse circuit includes a P-MOS transistor 411 having a source to which a power voltage VDD is applied, a gate to which a control signal CON is applied, and a drain to which an output node N for outputting the chip disable signal DIS is connected, and a fuse 413 having one end to which the output node N is connected and other end to which a ground voltage VSS is applied for disabling the chip.

When the fuse 413 is not cut out, the chip disable signal DIS has a logic low level. Otherwise, when the fuse 413 is cut out, and when the control signal CON has a logic low level, the chip disable signal DIS has a logic high level.

Figure 5:
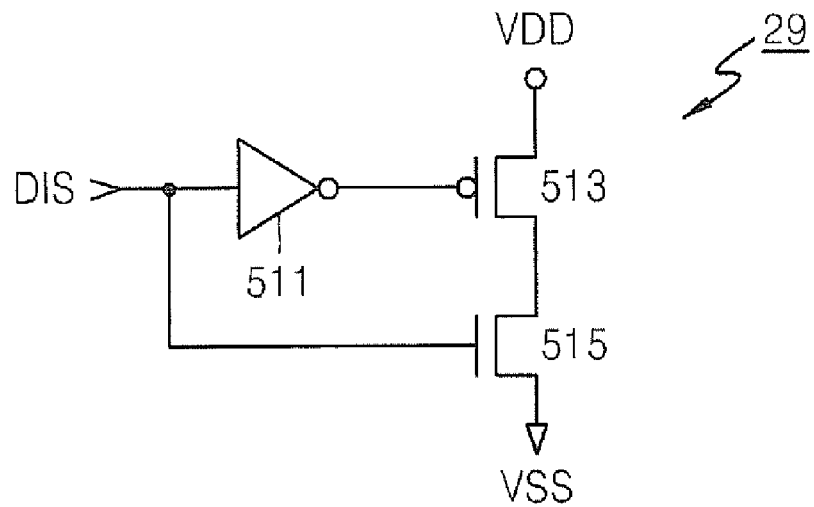
FIG. 5 is a circuit diagram illustrating an exemplary short current generation circuit of FIG. 2, according to some embodiments.

FIG. 5 is a circuit diagram illustrating an exemplary short current generation circuit of FIG. 2, according to some embodiments.

Referring to FIG. 5, the short current generation circuit includes an inverter 511 for inverting the chip disable signal DIS, a P-MOS transistor 513 having a source to which a power voltage VDD is applied and a gate to which an output signal of the inverter 511 is applied, and an N-MOS transistor 515 having a drain to which the drain of the P-MOS transistor 513 is connected, a gate to which the chip disable signal DIS is applied, and a source to which a ground voltage VSS is applied.

When the chip disable signal DIS has a logic high level (i.e., when the fuse 413 in the chip disable fuse circuit shown in FIG. 4 is cut out), both of the P-MOS and N-MOS transistors 513 and 515 are turned on. Accordingly, a short current flows via the P-MOS and N-MOS transistors 513 and 515.

When the chip disable signal DIS has a logic low level (i.e., when the fuse in the chip disable fuse circuit shown in FIG. 4 is not cut out), both of the P-MOS and N-MOS transistors 513 and 515 are turned off.

Figure 6:
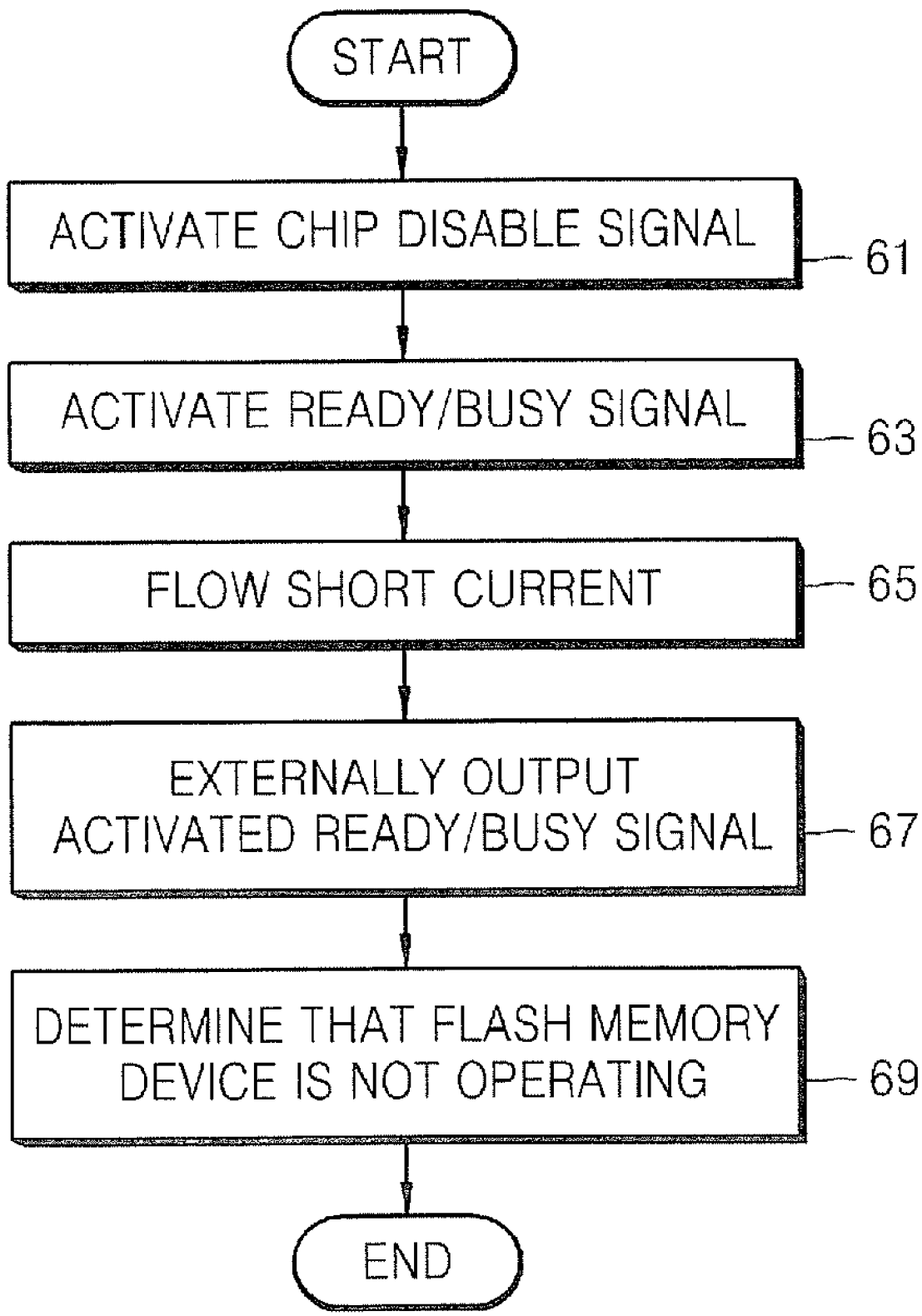
FIG. 6 is a flowchart illustrating methods of testing a flash memory device of FIG. 2 according to some embodiments.

FIG. 6 is a flowchart illustrating methods of testing the flash memory device of FIG. 2, according to some embodiments.

Referring to FIG. 6, test methods according to some embodiments include operations indicated by blocks 61 through 69. Hereinafter, test methods according to some embodiments will be described in more detail with reference to FIGS. 2 to 6.

First, if a defective chip is identified in the flash memory device during the test, the chip disable signal DIS is activated by cutting out the fuse in the chip disable fuse circuit 25 corresponding to the defective chip (operation 61). Subsequently, the ready/busy signal RB representing the operational state of the flash memory device is forced to a logic high level in response to activating the chip disable signal DIS (operation 63).

Then, an electrical short current flows in response to activating the chip disable signal DIS (operation 65). Then, the ready/busy signal RB activated to a logic high level is output from the flash memory device through the ready/busy output pin R/B (operation 67). If the activated ready/busy signal RB is externally output, it is determined that the flash memory device is not operational (operation 69).

Figure 7:
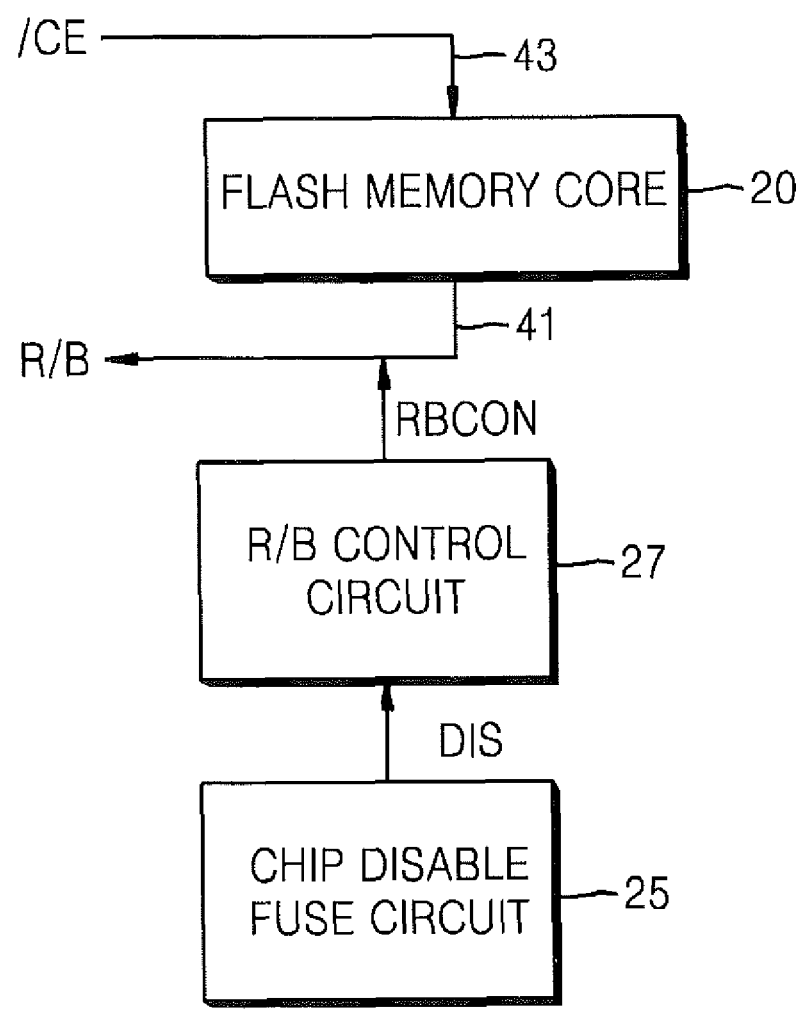
FIG. 7 is a block diagram schematically illustrating a flash memory device having a chip disable fuse circuit according to some embodiments.

Referring to FIG. 7, a flash memory device according to some embodiments includes a flash memory core 20. The flash memory core 20 includes the command receipt circuit 21 and the flash memory internal circuit 23 shown in FIG. 2. An output line 41 is coupled to the flash memory internal circuit 23 and to an external output pin R/B. An input line 43 is coupled to a chip enable pin/CE that receives an external chip enable signal nCE. A chip disable fuse circuit 25 generates a chip disable signal DIS when a fuse in the chip disable fuse circuit 25 is cut out. A ready/busy control circuit 27 generates a control signal RBCON in response to the chip disable signal DIS and applies the control signal RBCON to the external output pin R/B. Thus, when the chip disable signal DIS is set to a high logic level, the control signal RBCON is not applied to an input pin of the flash memory device, but rather to an output pin.

Consequently, in a flash memory device according to some embodiments, it can be determined that a chip does not operate during a test. Also, if it is determined the fuse was erroneously cut out after cutting out the fuse for disabling the chip, the state of the chip can be advantageously corrected for a new test by applying external commands to the disabled chip.

A flash memory device according to some embodiments may have the advantage of allowing an operator to determine that a chip is not operating. Also, if it is determined that the fuse was erroneously cut out for disabling the chip, the state of the chip can be advantageously corrected for a new test by applying external commands to the disabled chip.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A flash memory device, comprising:
 a ready/busy output pin that outputs a ready/busy signal representing an internal operational state of the flash memory device;
 a chip disable fuse circuit that includes a fuse and that outputs a chip disable signal when the fuse is cut out; and
 a ready/busy control circuit that activates the ready/busy signal output through the ready/busy output pin in response to the chip disable signal.

2. The flash memory device of claim 1, further comprising:
 a command receipt circuit that receives external commands;
 a flash memory internal circuit that operates in response to the commands input through the command receipt circuit; and
 a short current generation circuit that allows a short current to flow in response to the chip disable signal.

3. The flash memory device of claim 2, wherein the ready/busy signal is set to a first logic level when the flash memory internal circuit performs data programming, deletion, and/or reading operations, and the ready/busy signal is set to a second logic level, different from the first logic level, when the flash memory internal circuit completes the data programming, deletion, and/or reading operations.

4. The flash memory device of claim 2, wherein the command receipt circuit is configured to process the commands input thereto regardless of the state of the ready/busy signal.

5. The flash memory device of claim 2, wherein the command receipt circuit processes the commands in response to a chip enable signal input through a chip enable pin.

6. The flash memory device of claim 2, further comprising a ready/busy signal output circuit including a pull-up resistor and a pull-down transistor connected in series between a power voltage and a ground voltage, the ready/busy output pin being connected between the pull-up resistor and the pull-down transistor,
 wherein the ready/busy control circuit comprises:
 a first inverter that inverts the chip disable signal;
 a NAND gate that receives an output signal from the inverter and an internal ready/busy signal generated in the flash memory internal circuit; and
 a second inverter that inverts an output signal of the NAND gate to generate a ready/busy control signal and provides the ready/busy control signal to a gate of the pull-down transistor.

7. The flash memory device of claim 2, wherein the chip disable fuse circuit comprises:
 a P-MOS transistor having a source to which a power voltage is applied, a gate to which a control signal is applied, and a drain to which an output node for outputting the chip disable signal is connected; and
 a fuse having one connected to the output node and another end connected to a ground voltage.

8. The flash memory device of claim 2, wherein the short current generation circuit comprises:
 an inverter that inverts the chip disable signal;
 a P-MOS transistor having a source to which a power voltage is applied and a gate to which an output signal of the inverter is applied; and
 an N-MOS transistor having a drain to which a drain of the P-MOS transistor is connected, a gate to which the chip disable signal is applied, and a source to which a ground voltage is applied.

9. A method of testing a flash memory device, comprising:
 activating a chip disable signal by cutting out a fuse for disabling a chip in the flash memory device;
 activating a ready/busy signal representing an operational state of the flash memory device in response to activating the chip disable signal;
 outputting the activated ready/busy signal outside of the flash memory device through the ready/busy output pin; and
 determining, in response to the ready/busy signal, that the flash memory device is not operational.

10. The method of claim 9, further comprising flowing an electrical short current in response to activating the chip disable signal.

11. The method of claim 9, wherein the ready/busy signal is set to a first logic level when the flash memory device performs data programming, deletion, and/or reading operations, and the ready/busy signal is set to a second logic level, different from the first logic level, when the flash memory device completes the data programming, deletion, and/or reading operations.

12. A flash memory device, comprising:
 a flash memory core including a flash memory internal circuit;
 an external output pin coupled to the flash memory core;
 a chip disable fuse circuit that includes a fuse and that is configured to output a chip disable signal when the fuse is cut out; and a control circuit that is configured to generate a control signal in response to the chip disable signal and to apply the control signal to the external output pin.

13. The flash memory device of claim 12, further comprising:
a chip enable pin that is coupled to the flash memory core and that is configured to receive a chip enable signal; and
a command receipt circuit in the flash memory core that is configured to receive and process external commands in response to the chip enable signal irrespective of a state of the chip disable signal.

14. The flash memory device of claim 12, wherein the external output pin comprises a ready/busy output pin that is configured to output a ready/busy signal indicative of an internal operational state of the flash memory device.

15. The flash memory device of claim 14, further comprising:
a ready/busy control circuit that is configured, in response to the chip disable signal, to force the ready/busy signal to a logic level indicating that the flash memory device is not operational.

16. The flash memory device of claim 15, wherein the logic level comprises a first logic level, and wherein the ready/busy signal is set to the first logic level when the flash memory internal circuit performs data programming, deletion, and/or reading operations, and the ready/busy signal is set to a second logic level, different from the first logic level, when the flash memory internal circuit completes the data programming, deletion, and/or reading operations.

17. The flash memory device of claim 15, further comprising
a ready/busy signal output circuit including a pull-up resistor and a pull-down transistor connected in series between a power voltage and a ground voltage, the ready/busy output pin being connected between the pull-up resistor and the pull-down transistor,
wherein the ready/busy control circuit comprises:
a first inverter that inverts the chip disable signal;
a NAND gate that receives an output signal from the inverter and an internal ready/busy signal generated in the flash memory internal circuit; and
a second inverter that inverts an output signal of the NAND gate to generate a ready/busy control signal and provides the ready/busy control signal to a gate of the pull-down transistor.

18. The flash memory device of claim 13, further comprising:
a flash memory internal circuit that operates in response to the commands input through the command receipt circuit; and
a short current generation circuit that allows a short current to flow in response to the chip disable signal.

19. The flash memory device of claim 12, wherein the chip disable fuse circuit comprises:
a P-MOS transistor having a source to which a power voltage is applied, a gate to which a control signal is applied, and a drain to which an output node for outputting the chip disable signal is connected; and
a fuse having one connected to the output node and another end connected to a ground voltage.

* * * * *